(12) United States Patent
Takaishi et al.

(10) Patent No.: US 12,690,262 B2
(45) Date of Patent: Jul. 21, 2026

(54) SEMICONDUCTOR DEVICE HAVING DRIVE CIRCUIT CONFIGURED TO OUTPUT VOLTAGES APPLIED TO PLURALITY OF GATE ELECTRODES

(71) Applicant: DENSO CORPORATION, Kariya-city (JP)

(72) Inventors: Junpei Takaishi, Kariya-city (JP); Yusuke Masumoto, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 412 days.

(21) Appl. No.: 18/476,603

(22) Filed: Sep. 28, 2023

(65) Prior Publication Data

US 2024/0021721 A1 Jan. 18, 2024

Related U.S. Application Data

(63) Continuation of application No. PCT/JP2022/015504, filed on Mar. 29, 2022.

(30) Foreign Application Priority Data

May 14, 2021 (JP) ................................. 2021-082801

(51) Int. Cl.
*H10D 84/00* (2025.01)
*H10D 8/25* (2025.01)
*H10D 62/10* (2025.01)

(52) U.S. Cl.
CPC ............. *H10D 84/148* (2025.01); *H10D 8/25* (2025.01); *H10D 62/103* (2025.01)

(58) Field of Classification Search
CPC ....... H10D 84/148; H10D 62/103; H10D 8/25
See application file for complete search history.

(56) References Cited

U.S. PATENT DOCUMENTS

| | | | |
|---|---|---|---|
| 5,341,004 A | 8/1994 | Furuhata | |
| 6,153,896 A | 11/2000 | Omura et al. | |
| 2005/0161768 A1* | 7/2005 | Sugiyama ............ | H10D 12/481 |
| | | | 257/E29.198 |

(Continued)

FOREIGN PATENT DOCUMENTS

| | | |
|---|---|---|
| JP | 2000-101076 A | 4/2000 |
| JP | 2007-201247 A | 8/2007 |

(Continued)

*Primary Examiner* — Michael Jung
(74) *Attorney, Agent, or Firm* — Posz Law Group, PLC

(57) ABSTRACT

In a semiconductor device, a semiconductor element having a plurality of gate electrodes including a first gate electrode and a second gate electrode. An electrical connection member is electrically connected to a front surface electrode of the semiconductor element. A cell region of the semiconductor element includes a first cell region that allows a current to flow between the front surface electrode and a back surface electrode when the first gate electrode is applied with a voltage, and a second cell region that allows a current to flow between the front surface electrode and the back surface electrode when the second gate electrode is applied with a voltage. The semiconductor element and a control circuit are configured to generate a time difference in cutting off the current between the first cell region and the second cell region.

14 Claims, 10 Drawing Sheets

(56)     References Cited

U.S. PATENT DOCUMENTS

| | | | |
|---|---|---|---|
| 2012/0286288 A1 | 11/2012 | Hussein et al. | |
| 2013/0134521 A1 | 5/2013 | Misumi | |
| 2019/0355718 A1 | 11/2019 | Nakano et al. | |
| 2020/0098903 A1* | 3/2020 | Satoh | H10D 12/481 |
| 2021/0296475 A1* | 9/2021 | Iwakaji | H10D 62/106 |
| 2022/0045208 A1 | 2/2022 | Okuda et al. | |

FOREIGN PATENT DOCUMENTS

| | | | |
|---|---|---|---|
| JP | 4984485 | B2 | 7/2012 |
| JP | 2015-222743 | A | 12/2015 |
| JP | 2016-136819 | A | 7/2016 |
| JP | 6610758 | B2 | 11/2019 |
| JP | 2020-027878 | A | 2/2020 |

* cited by examiner

GATE CURRENT

SEMICONDUCTOR DEVICE HAVING DRIVE CIRCUIT CONFIGURED TO OUTPUT VOLTAGES APPLIED TO PLURALITY OF GATE ELECTRODES

CROSS REFERENCE TO RELATED APPLICATIONS

The present application is a continuation application of International Patent Application No. PCT/JP2022/015504 filed on Mar. 29, 2022, which designated the U.S. and claims the benefit of priority from Japanese Patent Application No. 2021-082801 filed on May 14, 2021. The entire disclosures of all of the above applications are incorporated herein by reference.

TECHNICAL FIELD

The present disclosure relates to a semiconductor device in which an electrical connection member is connected to a surface electrode of a semiconductor substrate.

BACKGROUND

For example, a semiconductor device has an electrical connection member connected to a surface electrode of a semiconductor element. Such an electrical connection member serves to connect the surface electrode of the semiconductor element to an external circuit and to dissipate heat so as to suppress the temperature of the semiconductor element from rising.

SUMMARY

The present disclosure describes a semiconductor device which is capable of improving a withstand capacity while suppressing an increase in an on-resistance. In a semiconductor device according to an aspect, a semiconductor element having a plurality of gate electrodes including a first gate electrode and a second gate electrode. An electrical connection member is disposed on a front surface side of the semiconductor element and electrically connected to a front surface electrode. A cell region of the semiconductor element includes a first cell region that allows a current to flow between the front surface electrode and a back surface electrode when the first gate electrode is applied with a voltage, and a second cell region that allows a current to flow between the front surface electrode and the back surface electrode when the second gate electrode is applied with a voltage. The semiconductor element and a control circuit are configured to generate a time difference in cutting off the current between the first cell region and the second cell region.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
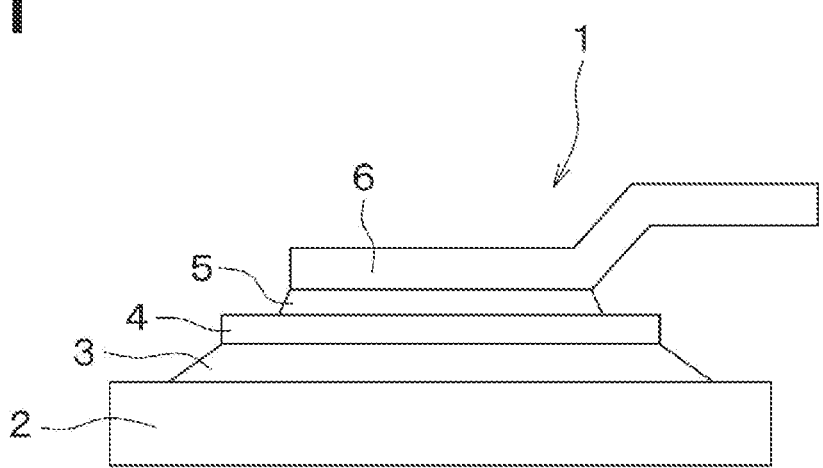
FIG. 1 is a diagram illustrating a side view of a semiconductor device according to a first embodiment of the present disclosure.

In a semiconductor device having an electrical connection member connected to a surface electrode of a semiconductor element, the electrical connection member serves to connect the surface electrode of the semiconductor element to an external circuit and to dissipate heat so as to suppress the temperature of the semiconductor element from rising.

In the semiconductor device having such an electrical connection member, a difference in thermal resistance occurs between a connection portion of the semiconductor element to which the electrical connection member is connected and a portion of the semiconductor element outside the connection portion. The difference in the thermal resistance is likely to promote a current positive feedback. As a result, the withstand capacity will be reduced, causing an element breakdown. To address such issues, a technique of thinning out cells in a region outside the connection portion to the electrical connection member has been proposed for alleviating heat concentration.

However, the thinning out the cells in such a way increases an on-resistance in a normal operation, resulting in an increase in power loss.

The present disclosure provides a semiconductor device which is capable of improving the withstand capacity while suppressing an increase in the on-resistance.

According to an aspect of the present disclosure, a semiconductor device includes a semiconductor element, a control circuit and an electrical connection member. The semiconductor element includes a substrate, a front surface electrode disposed adjacent to a front surface of the substrate, a back surface electrode disposed adjacent to a back surface the substrate, and a plurality of gate electrodes disposed adjacent to the front surface of the substrate. The semiconductor element is configured so that an electrical conduction and cutoff between the front surface electrode and the back surface electrode is controlled by application of voltages to the plurality of gate electrodes. The control circuit includes a connection circuit that connects a drive circuit and the plurality of gate electrodes, the drive circuit being configured to output the voltages applied to the plurality of gate electrodes. The electrical connection member is disposed on a front surface side of the semiconductor element and electrically connected to the front surface electrode. The plurality of gate electrodes include a first gate electrode and a second gate electrode. The semiconductor element has a cell region. The cell region includes a first cell region that allows a current to flow between the front surface electrode and the back surface electrode when the first gate electrode is applied with the voltage, and a second cell region that allows a current to flow between the front surface electrode and the back surface electrode when the second gate electrode is applied with the voltage. The semiconductor element and the control circuit are configured to generate a time difference in current cutoff between the first cell region and the second cell region at a time of cutting off the currents flowing through the first cell region and the second cell region.

In such a configuration, both of the first and second cell regions are operated in a normal operation. When the current is cut off, the current in one of the first and second cell regions is cut off prior to the other, so that the number of cells can be reduced in a pseudo manner. Therefore, it is possible to suppress the temperature rise due to the current positive feedback at the time of cutting off the current and improve the withstand capacity of the semiconductor element, while suppressing the increase in the on-resistance in the normal operation.

Embodiments of the present disclosure will be hereinafter described with reference to the drawings. In the following descriptions, the same or equivalent parts are denoted by the same reference numerals throughout the embodiments.

First Embodiment

The following describes a first embodiment of the present disclosure. A semiconductor device 1 of the present embodiment shown in FIG. 1 is, for example, used in a load drive circuit that supplies electric power to an electric load such as a vehicle electronic control unit (ECU). The semiconductor device 1 includes a lead frame 2, a solder 3, a semiconductor element 4, a solder 5, and an electrical connection member 6.

The lead frame 2 is a plate-shaped member that supports the semiconductor element 4. The lead frame 2 is made of a conductive material such as copper. A back surface of the semiconductor element 4 is bonded to a front surface of the lead frame 2 by the solder 3.

The semiconductor element 4 is a switching element, such as a metal oxide semiconductor field effect transistor (MOSFET) or an insulated gate bipolar transistor (IGBT), that controls on and off of an electrical conduction state according to a voltage application.

In the present embodiment, a case where the semiconductor element 4 is a trench gate type double-diffused MOSFET (DMOS) element having a source electrode and a gate electrode on a front surface side and a drain electrode on a back surface side will be described. The back surface of the electrical connection member 6 is bonded to the front surface of the semiconductor element 4 with the solder 5.

The electrical connection member 6 connects the source electrode of the semiconductor element 4 to a lead portion (not shown) of the lead frame 2. The electrical connection member 6 is made of a conductive material such as copper. The electrical connection member 6 also has a function of dissipating heat of the semiconductor element 4 and suppressing a temperature rise of the semiconductor element 4. The electrical connection member 6 of the present embodiment is called as a heat dissipation plate, a heat spreader, a clip, or the like. The electrical connection member 6 has an end portion of a rectangular plate shape, and the end portion is placed on the front surface side of the semiconductor element 4.

Figure 2:
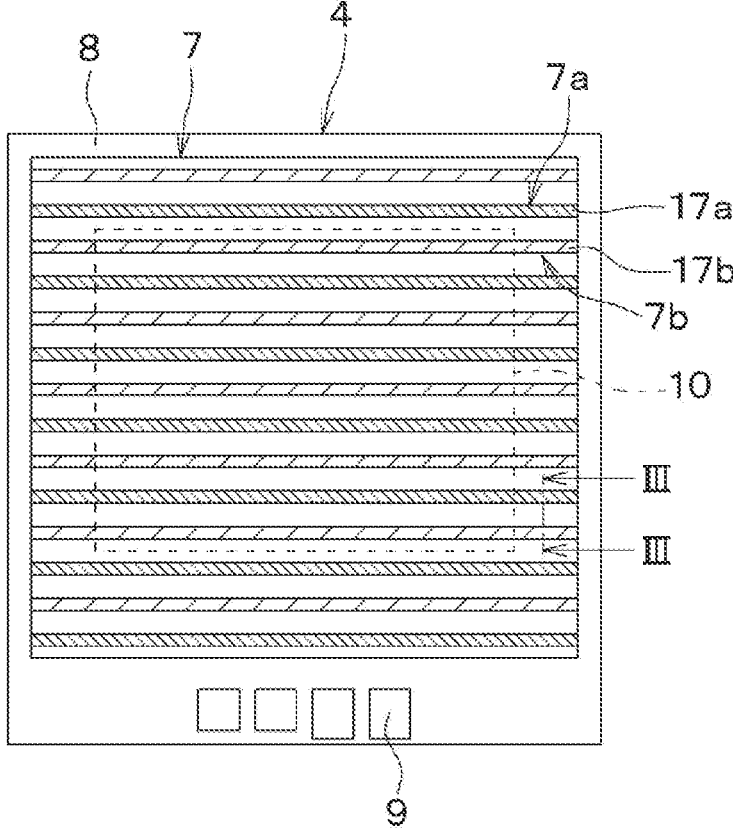
FIG. 2 is a diagram illustrating a top view of the semiconductor device according to the first embodiment.
Figure 3:
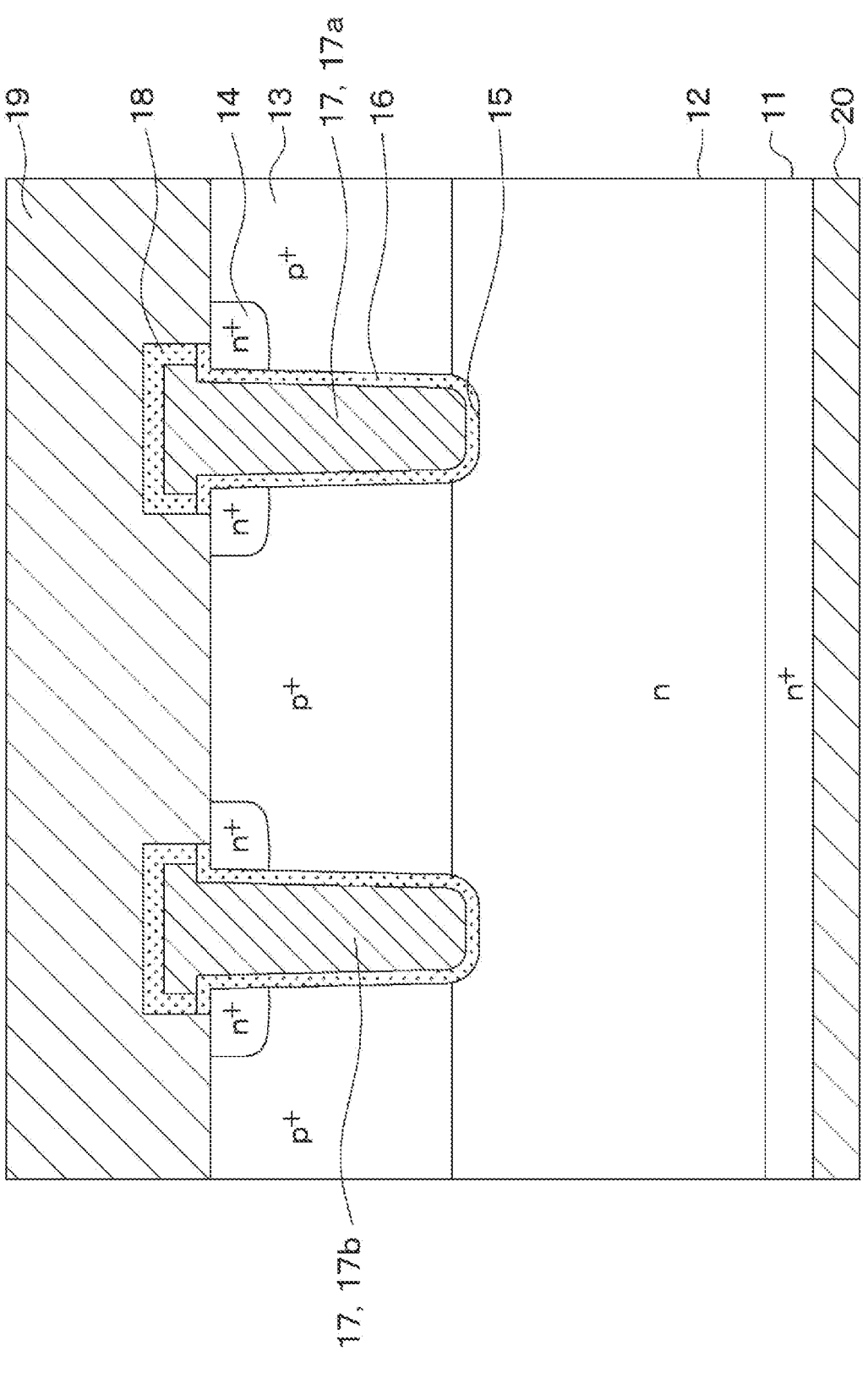
FIG. 3 is a diagram illustrating a cross-sectional view taken along a line III-Ill in FIG. 2.

A detailed configuration of the semiconductor element 4 will be described. As shown in FIG. 2, the semiconductor element 4 has a structure in which an outer peripheral region 8 is arranged so as to surround a quadrangular cell region 7. A large number of trench gate DMOSs shown in FIG. 3 are formed in the cell region 7, and a gate pad 9 is formed in the outer peripheral region 8. The gate pad 9 is connected to a gate electrode 17, which will be described later.

The solder 5 and the electrical connection member 6 are disposed so as to cover a part of the cell region 7, so that heat is dissipated mainly in this part, that is, a part of the semiconductor element 4 located below the electrical connection member 6. This part where the heat dissipation is conducted is referred to as a heat dissipation region 10. In the present embodiment, the heat dissipation region 10 is a rectangular region provided in an inner part of the cell region 7.

As shown in FIG. 3, the semiconductor element 4 includes a substrate 11, an n-type epitaxial layer 12, a p-type high impurity layer 13, an $n^+$-type source region 14, a trench 15, a gate insulating film 16, a gate electrode 17, an interlayer insulating film 18, a source electrode 19, and a drain electrode 20.

The substrate 11 is made of, for example, silicon. The n-type epitaxial layer 12 is formed on a front surface of the substrate 11. In the semiconductor element 4, parts constituting the DMOS or the like are formed above the n-type epitaxial layer 12.

The p-type high impurity layer 13 is formed in the surface layer portion of the n-type epitaxial layer 12. The p-type high impurity layer 13 is formed by ion implantation of a p-type impurity from the surface of the n-type epitaxial layer 12 to a predetermined depth. The p-type high impurity layer 13 functions as a p-type body layer and also functions as a p-type channel layer that forms a channel of the MOSFET.

The $n^+$-type source region 14 is formed in a part of the surface layer portion of the p-type high impurity layer 13. The $n^+$-type source region 14 is formed by ion implantation of an n-type impurity from the surface of the p-type high impurity layer 13 to a predetermined depth. Multiple n+-type source regions 14 are formed. The multiple n+-type source regions 14 are formed in a stripe shape with one direction parallel to the surface of the substrate 11 as a longitudinal direction.

A trench 15 is formed in a portion of the semiconductor element 4 where the n+-type source region 14 is formed. The trench 15 is formed so as to penetrate the n+-type source region 14 and the p-type high impurity layer 13 and to reach the n-type epitaxial layer 12. Multiple trenches 15 are formed correspondingly to the n+-type source regions 14. The multiple trenches 15 are formed in a stripe shape with the same direction as the n+-type source regions 14 as the longitudinal direction.

The gate insulating film 16 is formed on an inner wall surface of the trench 15. The gate insulating film 16 is made of an oxide film or the like. The gate electrode 17 is formed on the front surface side of the substrate 11 so as to fill the trench 15 on the front surface of the gate insulating film 16. The gate electrode 17 is connected to the gate pad 9 by a gate wiring layer (not shown).

As will be described later, a source electrode 19 is formed on the front surface side of the semiconductor element 4, and a drain electrode 20 is formed on the back surface side of the semiconductor element 4. When a gate voltage is applied to the gate electrode 17 via the gate pad 9 and the gate wiring layer (not shown), a channel is formed in a portion of the p-type high impurity layer 13 that is in contact with the side surface of the trench 15, so a drain current is caused to flow between the source electrode 19 and the drain electrode 20.

Multiple gate electrodes 17 are formed correspondingly to the n+-type source regions 14 and the trenches 15. The multiple gate electrodes 17 include a first gate electrode 17a and a second gate electrode 17b. In the cell region 7, a region that allows a current to flow between the source electrode 19 and the drain electrode 20 by application of the voltage to the first gate electrode 17a is referred to as a first cell region 7a. In the cell region 7, a region that allows a current to flow between the source electrode 19 and the drain electrode 20 by application of the voltage to the second gate electrode 17b is referred to as a second cell region 7b.

As shown in FIG. 2, the first gate electrodes 17a and the second gate electrodes 17b are formed into a stripe shape and are alternately arranged. The first cell regions 7a and the second cell regions 7b are formed into a stripe shape along the extending direction of the first gate electrodes 17a and the second gate electrodes 17b, so the first cell regions 7a and the second cell regions 7b are alternately arranged.

Multiple gate pads 9 are formed in the outer peripheral region 8. The first gate electrodes 17a and the second gate electrodes 17b are connected to different gate pads 9, so that the first gate electrodes 17a and the second gate electrodes 17b can be connected to a drive circuit 26, which will be described later, through different paths.

The interlayer insulating film 18 is formed on the gate electrode 17. A contact hole is formed in the interlayer insulating film 18 so as to expose the surfaces of the p-type high impurity layer 13 and the n+-type source region 14 while covering the gate electrode 17. The source electrode 19 is formed on the front surface side of the substrate 11 so as to cover the interlayer insulating film 18 and be in contact with the p-type high impurity layer 13 and the n+-type source region 14 through the contact hole of the interlayer insulating film 18. The source electrode 19 corresponds to a surface electrode.

The source electrode 19 is formed on the entire cell region 7, and an outer edge portion is covered with a protective film (not shown). A region of the source electrode 19 inside the outer edge portion is exposed from the protective film, and this region serves as a source pad for external connection. The semiconductor element 4 is electrically connected to the electrical connection member 6 via the solder 5 at this source pad. Heat is transferred from the source electrode 19 to the electrical connection member 6 via the solder 5, so that the temperature rise of the semiconductor element 4 is suppressed.

The drain electrode 20 is formed on the back surface side of the substrate 11, that is, on the surface of the substrate 11 opposite to the n-type epitaxial layer 12. The drain electrode 20 corresponds to a back surface electrode. The MOSFET in the cell region 7 is formed to have such a configuration, and electrical conduction and interruption between the source electrode 19 and the drain electrode 20 are controlled in accordance with the voltage application to the gate electrode 17.

Figure 4:
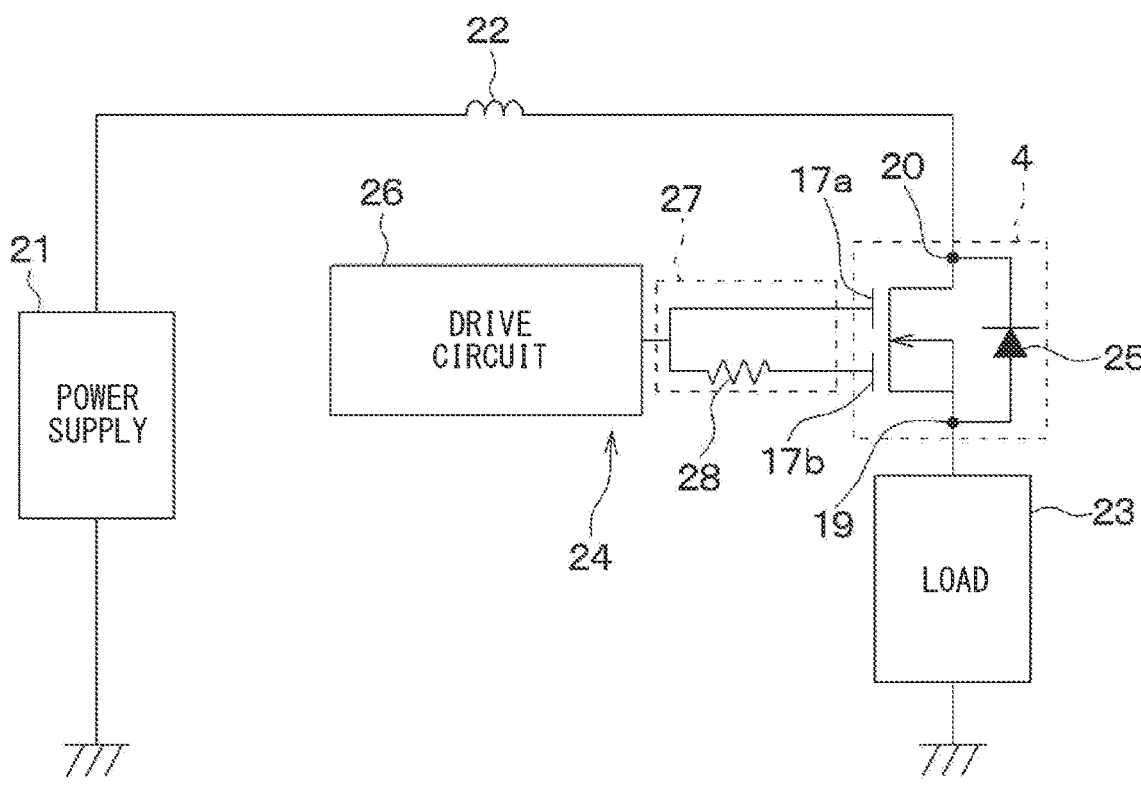
FIG. 4 is a circuit diagram of a load drive circuit using the semiconductor device according to the first embodiment.

A load drive circuit using the semiconductor device 1 will be described. A load drive circuit shown in FIG. 4 is configured to turn on and off the current supplied from a power supply to an electric load by the semiconductor element 4. The load drive circuit includes the semiconductor element 4, a power supply 21, a wiring 22, a load 23, and a control circuit 24.

The power supply 21 is connected to the drain electrode 20 of the semiconductor element 4 via the wiring 22. The load 23 is connected to the source electrode 19 of the semiconductor element 4. A diode 25 shown in FIG. 4 is a parasitic diode composed of the n-type epitaxial layer 12 and the p-type high impurity layer 13 of the semiconductor element 4. The gate electrodes 17 of the semiconductor element 4 are connected to the control circuit 24.

The control circuit 24 is configured to apply a voltage to the multiple gate electrodes 17. The control circuit 24 includes a drive circuit 26 and a connection circuit 27. The drive circuit 26 outputs a voltage to be applied to the multiple gate electrodes 17. The drive circuit 26 is connected to the multiple gate electrodes 17 via the connection circuit 27. The semiconductor device 1 includes the connection circuit 27 of the control circuit 24. The drive circuit 26 may be provided in the semiconductor device 1 or may be provided outside the semiconductor device 1.

The semiconductor element 4 and the control circuit 24 are configured to cause a time difference in current cutoff between the first cell region 7a and the second cell region 7b, when cutting off the currents flowing in the first cell region 7a and the second cell region 7b.

Specifically, the semiconductor element 4 and the control circuit 24 are configured such that, when cutting off the currents flowing in the first cell region 7a and the second cell region 7b, the drain current in the first cell region 7a is cut off before the drain current in the second cell region 7b is cut off. The first cell regions 7a are formed so as to include a portion outside of the region located below the electrical connection member 6 in the semiconductor element 4, and the second cell regions 7b are formed so as to include a portion located below the electrical connection member 6 in the semiconductor element 4.

As shown in FIG. 2, in the present embodiment, both the first cell regions 7a and the second cell regions 7b are formed in a region of the semiconductor element 4 located below the electrical connection member 6, that is, the heat dissipation region 10, and in a region outside of the heat dissipation region 10.

In the present embodiment, the connection circuit 27 is configured to generate a difference in conduction resistance between the first cell region 7a and the second cell region 7b, thereby causing the time difference in current cutoff. Specifically, the first gate electrode 17a and the second gate electrode 17b are connected to the drive circuit 26 via the different paths of the connection circuit 27. In the connection circuit 27, a portion connecting the first gate electrode 17a and the drive circuit 26 and a portion connecting the second gate electrode 17b and the drive circuit 26 have different resistance values.

For example, as shown in FIG. 4, the connection circuit 27 includes a circuit that short-circuits the first gate electrode 17a and the drive circuit 26, and a circuit that connects the second gate electrode 17b and the drive circuit 26 via a resistor 28.

Figure 5:
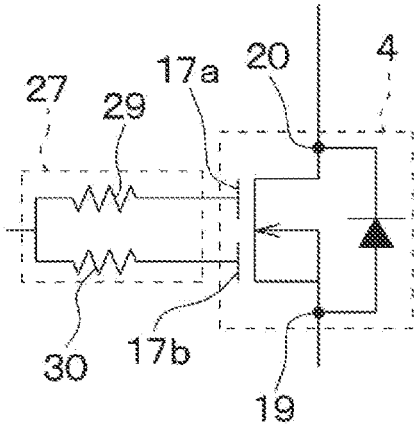
FIG. 5 is a circuit diagram of a semiconductor element and a control circuit according to the first embodiment.

As another example, as shown in FIG. 5, the first gate electrode 17a and the drive circuit 26 are connected via a resistor 29, and the second gate electrode 17b and the drive circuit 26 are connected via a resistor 30. The resistance values of the resistor 29 and the resistor 30 are referred to as R1 and R2, respectively. The resistance values R1 and R2 of the resistors 29 and 30 satisfy a relationship of R1<R2. The resistor 29 and the resistor 30 correspond to a first resistor and a second resistor, respectively.

In this way, since a gate resistance value of the second gate electrode 17b is larger than a gate resistance value of the first gate electrode 17a, when the voltage applied from the drive circuit 26 to the multiple gate electrodes 17 is turned off, the drain current of the first cell region 7a is cut off before the drain current of the second cell region 7b is cut off. That is, the cells on the semiconductor element 4 are thinned out in a pseudo manner.

Figure 6:
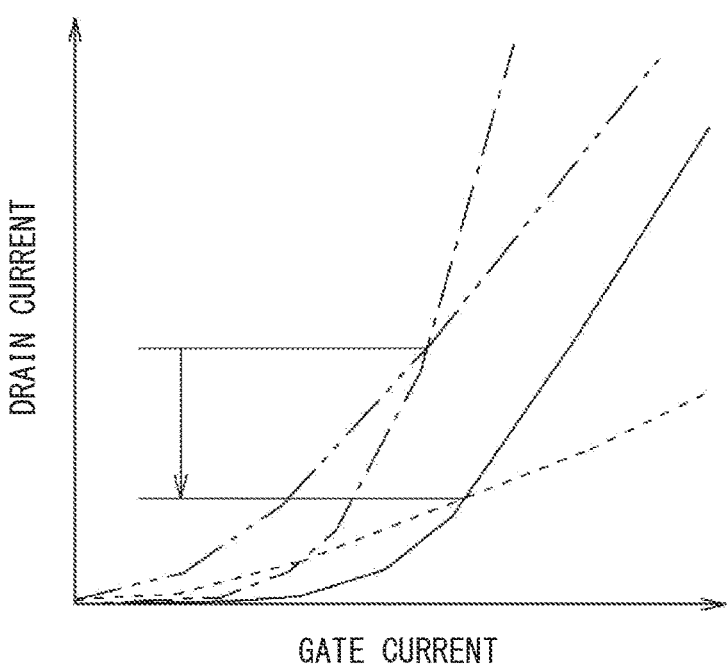
FIG. 6 is a diagram illustrating a relationship between a gate voltage and a drain current.

FIG. 6 shows the relationship between the gate voltage and the drain current of a case where only the first cell region 7a is operated and a case where both the first cell region 7a and the second cell region 7b are operated. In FIG. 6, a solid line indicates the relationship between the gate voltage and the drain current of the case where only the first cell region 7a is operated at room temperature, and a broken line indicates the relationship between the gate voltage and the drain current of the case where only the cell region 7a is operated at high temperature. Also, an alternate long and short dash line indicates the relationship between the gate voltage and the drain current of the case where both the first cell region 7a and the second cell region 7b are operated at room temperature. An alternate long and double-short dash line indicates the relationship between the gate voltage and the drain current of the case where both the first cell region 7a and the second cell region 7b are operated at high temperature.

As shown by the arrow in FIG. 6, in the case where only the first cell region 7a is operated, that is, in the case where the cells are artificially thinned out, the difference between the drain current at room temperature and the drain current at high temperature in the operation region at the time of interruption is smaller than that in the case where both the first cell region 7a and the second cell region 7b are operated. As described above, by thinning out the cells, the difference between the drain current at room temperature and the drain current at high temperature is reduced, and the temperature rise due to the current positive feedback can be reduced.

When a ground fault occurs between the semiconductor element 4 and the load 23, the drive circuit 26 transmits a control signal to the semiconductor element 4 to lower the voltage of the gate electrode 17, thereby cutting off the current supplied to the load 23. In this case, there is the difference in thermal resistance between the inside and the outside of the heat dissipation region 10 in the semiconductor element 4. Therefore, the difference in thermal resistance promotes current positive feedback, so that the withstand capacity decreases, and there is a possibility that an element breakdown occurs. In this regard, there is a method of reducing the number of cells outside the heat dissipation region 10 to alleviate heat concentration and suppress a temperature rise due to the positive current feedback. However, the reducing the number of cells, that is, thinning out the cells in this way causes the increase in the on-resistance in a normal operation and the increase in the power loss.

In contrast, in the present embodiment, both the first cell region 7a and the second cell region 7b are operated in the normal operation. When the drain current is cut off, the drain current of one of the cell regions 7a and 7b is cut off prior to the other, so that the number of cells is reduced in a pseudo manner. Therefore, it is possible to suppress the temperature rise due to the current positive feedback at the time of cutting off the current and improve the withstand capacity of the semiconductor element 4 while suppressing the increase in the on-resistance in the normal operation.

According to the embodiment described above, the following advantageous effects will be achieved.

(1) The semiconductor element 4 and the control circuit 24 are configured such that, when cutting off the currents flowing through the first cell region 7a and the second cell region 7b, the current in the first cell region 7a is cut off before the current in the second cell region 7b is cut off due to the difference in conduction resistance between the first cell region 7a and the second cell region 7b.

The electrical connection member 6 is placed so as to cover a part of the front surface side of the substrate 11, and the first cell regions 7a are formed to be included in the region outside of the region located below the electrical connection member 6 in the semiconductor element 4. The second cell regions 7b are formed to be included in the region located below the electrical connection member 6 in the semiconductor element 4.

In this manner, since the first cell region 7a, the drain current of which is cut off prior to the other, is disposed outside the heat dissipation region 10, it is possible to further suppress the temperature rise due to the current positive feedback.

Second Embodiment

The following describes a second embodiment of the present disclosure. In the present embodiment, the arrangements of the first cell region 7a and the second cell region 7b are changed from those of the first embodiment, and the other parts are similar to those of the first embodiment. Therefore, only the part different from the first embodiment will be described.

In the present embodiment, of the first cell region 7a and the second cell region 7b, only the second cell region 7b is formed in a region of the semiconductor element 4 located below the electrical connection member 6. That is, the first cell region 7a is not formed in the region of the semiconductor element 4 located below the electrical connection member 6. Both the first cell region 7a and the second cell region 7b are formed in a region outside the region of the semiconductor element 4 located below the electrical connection member 6.

Figure 7:
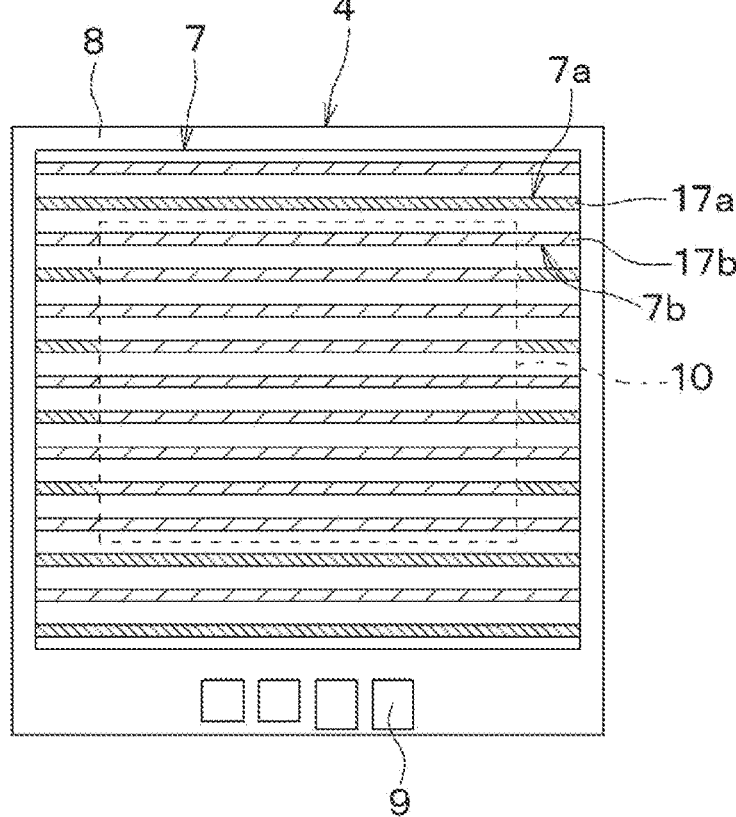
FIG. 7 is a diagram illustrating a top view of a semiconductor device according to a second embodiment of the present disclosure.

Specifically, as shown in FIG. 7, the second cell regions 7b are formed into a stripe shape in the heat dissipation region 10, and the first cell regions 7a and the second cell regions 7b are formed into a stripe shape and alternately arranged in the region outside the heat dissipation region 10.

The present embodiment can achieve the similar effects to those of the first embodiment by the similar configuration and operation to those of the first embodiment.

According to the embodiment described above, it is possible to further achieve the following advantageous effects.

(1) In the region of the semiconductor element 4 located below the electrical connection member 6, the second cell regions 7b are formed, but the first cell regions 7a are not formed. In the region of the semiconductor element 4 outside the region located below the electrical connection member 6, the first cell regions 7a and the second cell regions 7b are both formed. Accordingly, since the number of cells is reduced in a pseudo manner only in the region outside the heat dissipation region 10 at the time of interruption, it is possible to efficiently suppress the temperature rise due to the current positive feedback.

Third Embodiment

The following describes a third embodiment of the present disclosure. In the present embodiment, the number of the first cell regions 7a and the number of the second cell regions 7b are different from those in the second embodiment, and the other parts are similar to those in the second embodiment. Therefore, only the part different from the second embodiment will be described.

Figure 8:
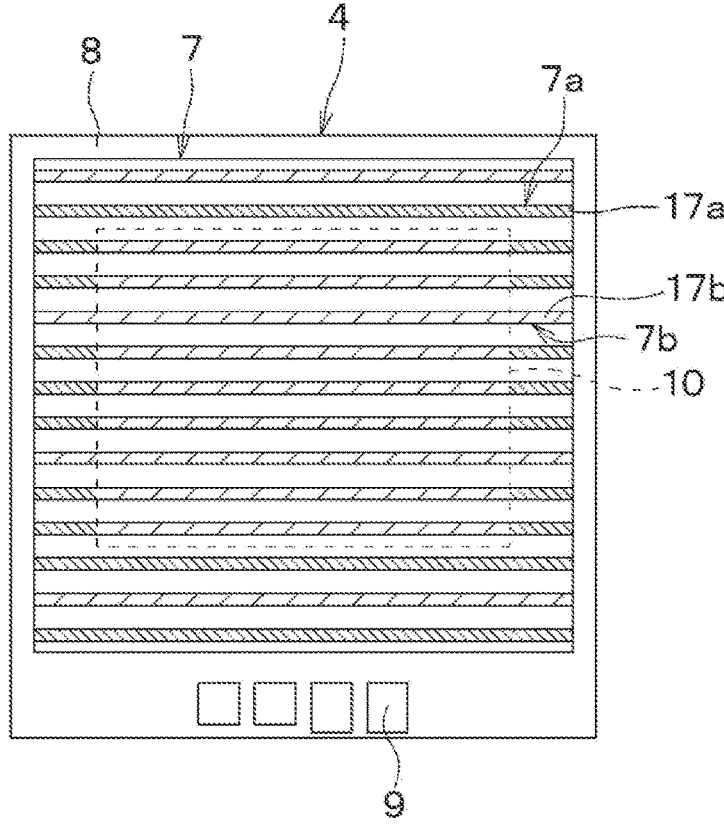
FIG. 8 is a diagram illustrating a top view of a semiconductor device according to a third embodiment of the present disclosure.

In the present embodiment, multiple cell regions 7a and one second cell region 7b are alternately arranged in a stripe shape. Specifically, as shown in FIG. 8, a unit of three first cell regions 7a and one second cell region 7b are alternately arranged in the region outside the heat dissipation region 10.

The present embodiment can achieve the similar effects to those of the first and second embodiments by the similar configuration and operation to those of the first and second embodiments.

According to the embodiment described above, it is possible to further achieve the following advantageous effects.

(1) The unit of the multiple first cell regions 7a and one second cell region 7b are alternately arranged. In a case where the semiconductor element 4 has a fine structure, the semiconductor element 4 having such a configuration can be manufactured more easily than the semiconductor element 4 having a configuration in which one first cell region 7a and one second cell region 7b are alternately arranged.

Fourth Embodiment

The following describes a fourth embodiment of the present disclosure. In the present embodiment, the arrangement of the connection circuit 27 is changed from that in the first embodiment, and the other parts are similar to those in the first embodiment. Therefore, only the part different from the first embodiment will be described.

Figure 9:
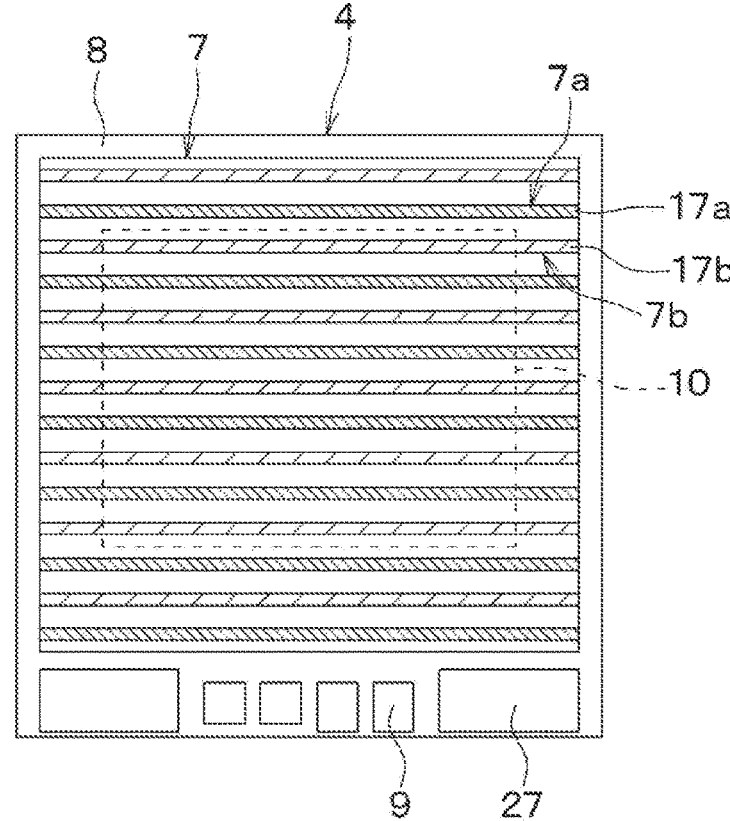
FIG. 9 is a diagram illustrating a top view of a semiconductor device according to a fourth embodiment of the present disclosure.

In the present embodiment, the connection circuit 27 is formed in a region of the semiconductor element 4 where no cell is arranged. Specifically, as shown in FIG. 9, the connection circuit 27 is disposed at a position apart from the cell region 7 and the gate pad 9 in the outer peripheral region 8.

The present embodiment can achieve the similar effects to those of the first embodiment by the similar configuration and operation to those of the first embodiment.

According to the embodiment described above, it is possible to further achieve the following advantageous effects.

(1) The connection circuit 27 is formed in a region of the semiconductor element 4 where no cell is arranged. In this way, since the cells of the semiconductor element 4 and the connection circuit 27 are formed in one substrate, a circuit configuration using the semiconductor device 1 is simplified.

Fifth Embodiment

The following describes a fifth embodiment of the present disclosure. In the present embodiment, the configuration of the connection circuit 27 is changed from that in the first embodiment, and the other par are similar to those of the first embodiment. Therefore, only the part different from the first embodiment will be described.

In the present embodiment, a Zener diode is used to generate the time difference in current cutoff between the first cell region 7a and the second cell region 7b.

Figure 10:
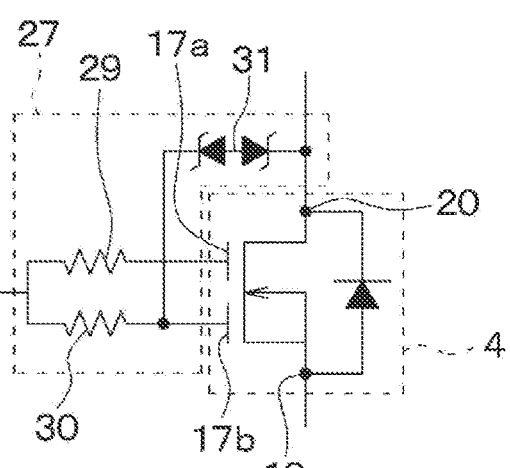
FIG. 10 is a circuit diagram of a semiconductor element and a control circuit according to a fifth embodiment of the present disclosure.

For example, as shown in FIG. 10, the connection circuit 27 includes a bidirectional Zener diode 31 in addition to the resistors 29 and 30. The resistance value R1 of the resistor 29 and the resistance value R2 of the resistor 30 are equal to each other. The fact that the resistance value R1 and the resistance value R2 are equal to each other includes not only that they are exactly equal to each other but also that they are substantially equal to each other.

The second gate electrode 17b and the drain electrode 20 are connected via the Zener diode 31. A breakdown voltage of the Zener diode 31, when the potential of the drain electrode 20 is considered from the second gate electrode 17b, is higher than the voltage applied to the second gate electrode 17b in the normal operation of the semiconductor element 4.

In such a configuration, at the time of cutting off the current, the gate voltage decreases in the first cell region 7a, whereas the second cell region 7b is applied with the voltage by the Zener diode 31. Therefore, the current cutoff is slower in the second cell region 7b than in the first cell region 7a.

Figure 11:
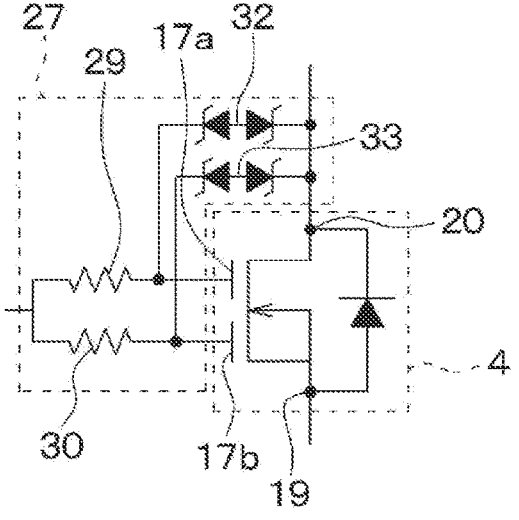
FIG. 11 is a circuit diagram of a semiconductor element and a control circuit according to the fifth embodiment.

Alternatively, as shown in FIG. 11, the connection circuit 27 includes bidirectional Zener diodes 32 and 33 in addition to the resistors 29 and 30. The resistance value R1 of the resistor 29 and the resistance value R2 of the resistor 30 are equal to each other. The first gate electrode 17a and the drain electrode 20 are connected via the Zener diode 32, and the second gate electrode 17b and the drain electrode 20 are connected via the Zener diode 33.

The breakdown voltage of the Zener diode 32, when the potential of the drain electrode 20 is considered from the first gate electrode 17a side, is larger than the voltage applied to the first gate electrode 17a during the normal operation of the semiconductor element 4. The breakdown voltage of the Zener diode 33, when the potential of the drain electrode 20 is considered from the second gate electrode 17b side, is larger than the voltage applied to the second gate electrode 17b in the normal operation of the semiconductor element 4.

The breakdown voltage of the Zener diode 33 considered from the drain electrode 20 side is smaller than the breakdown voltage of the Zener diode 32 considered from the drain electrode 20 side. The Zener diode 32 and the Zener diode 33 correspond to a first Zener diode and a second Zener diode, respectively.

In such a configuration, when cutting off the current, both the first cell region 7a and the second cell region 7b are applied with the voltages by the Zener diode 32 and the Zener diode 33. However, since the breakdown voltage of the Zener diode 33 is smaller than that of the Zener diode 32, the current cutoff is slower in the second cell region 7*b* than in the first cell region 7*a*.

The present embodiment can achieve the similar effects to those of the first embodiment from the similar configuration and operation to those of the first embodiment.

Sixth Embodiment

The following describes a sixth embodiment of the present disclosure. In the present embodiment, the configuration of the connection circuit 27 is changed from that of the first embodiment, and the other part are similar to those of the first embodiment. Therefore, only the part different from the first embodiment will be described.

In the present embodiment, a delay circuit is used to generate the time difference in current cutoff between the first cell region 7*a* and the second cell region 7*b*.

Figure 12:
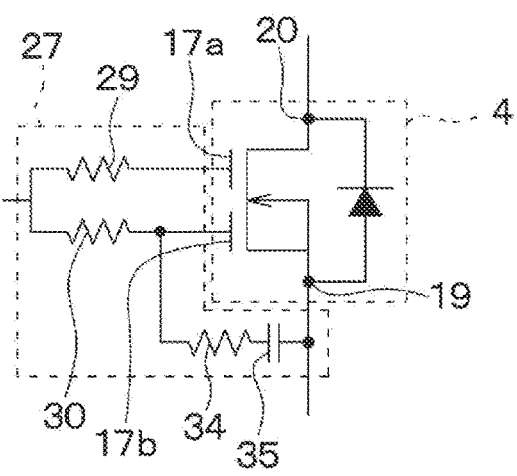
FIG. 12 is a circuit diagram of a semiconductor element and a control circuit according to a sixth embodiment of the present disclosure.

For example, as shown in FIG. 12, the connection circuit 27 includes a resistor 34 and a capacitor 35 in addition to the resistors 29 and 30. The resistance value R1 of the resistor 29 and the resistance value R2 of the resistor 30 are equal to each other. The second gate electrode 17*b* and the source electrode 19 are connected to each other via a circuit in which the resistor 34 and the capacitor 35 are connected in series. The resistor 34 corresponds to a third resistor.

In such a configuration, at the time of cutting off the current, although the gate voltage decreases in the first cell region 7*a*, the voltage decrease is delayed in the second cell region 7*b* due to the delay circuit composed of the resistor 34 and the capacitor 35, and thus the current cutoff is slower in the second cell region 7*b* than in the first cell region 7*a*.

Figure 13:
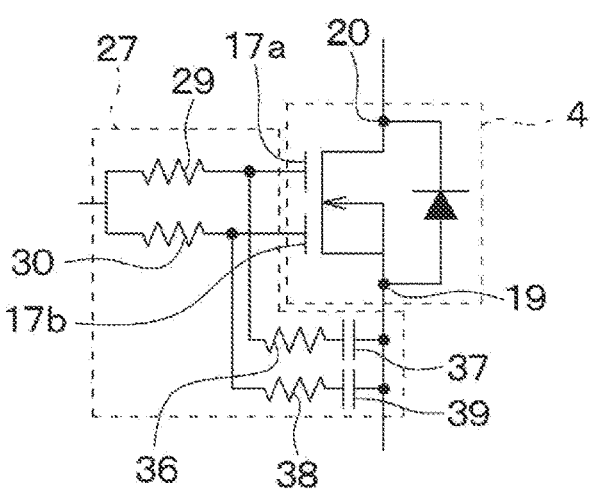
FIG. 13 is a circuit diagram of a semiconductor element and a control circuit according to the sixth embodiment.

Alternatively, as shown in FIG. 13, the connection circuit 27 includes a resistor 36, a capacitor 37, a resistor 38, and a capacitor 39 in addition to the resistors 29 and 30. The resistance value R1 of the resistor 29 and the resistance value R2 of the resistor 30 are equal to each other. The first gate electrode 17*a* and the source electrode 19 are connected via a circuit in which the resistor 36 and the capacitor 37 are connected in series, and the second gate electrode 17*b* and the source electrode 19 are connected via a circuit in which the resistor 38 and the capacitor 39 are connected in series. The capacitance of the capacitor 39 is larger than the capacitance of the capacitor 37. The resistor 36 and the resistor 38 correspond to a fourth resistor and a fifth resistor, respectively, and the capacitor 37 and the capacitor 39 correspond to a first capacitor and a second capacitor, respectively.

In such a configuration, the voltage decrease is delayed in both the first cell region 7*a* and the second cell region 7*b* by the delay circuit including the resistor 36 and the capacitor 37 and the delay circuit including the resistor 38 and the capacitor 39 at the time of cutting off the currents. However, since the capacitance of the capacitor 39 is larger than that of the capacitor 37, the current cutoff is slower in the second cell region 7*b* than in the first cell region 7*a*.

The present embodiment can achieve the similar effects to those of the first embodiment from the similar configuration and operation to those of the first embodiment.

Seventh Embodiment

The following describes a seventh embodiment of the present disclosure. In the present embodiment, the configurations of the semiconductor element 4 and the connection circuit 27 are changed from those of the first embodiment, and the other parts are similar to those of the first embodiment. Therefore, only the part different from the first embodiment will be described.

In the present embodiment, a difference in threshold voltage is provided between the first gate electrode 17*a* and the second gate electrode 17*b*, to cause the time difference in current cutoff between the first cell region 7*a* and the second cell region 7*b*.

Figure 14:
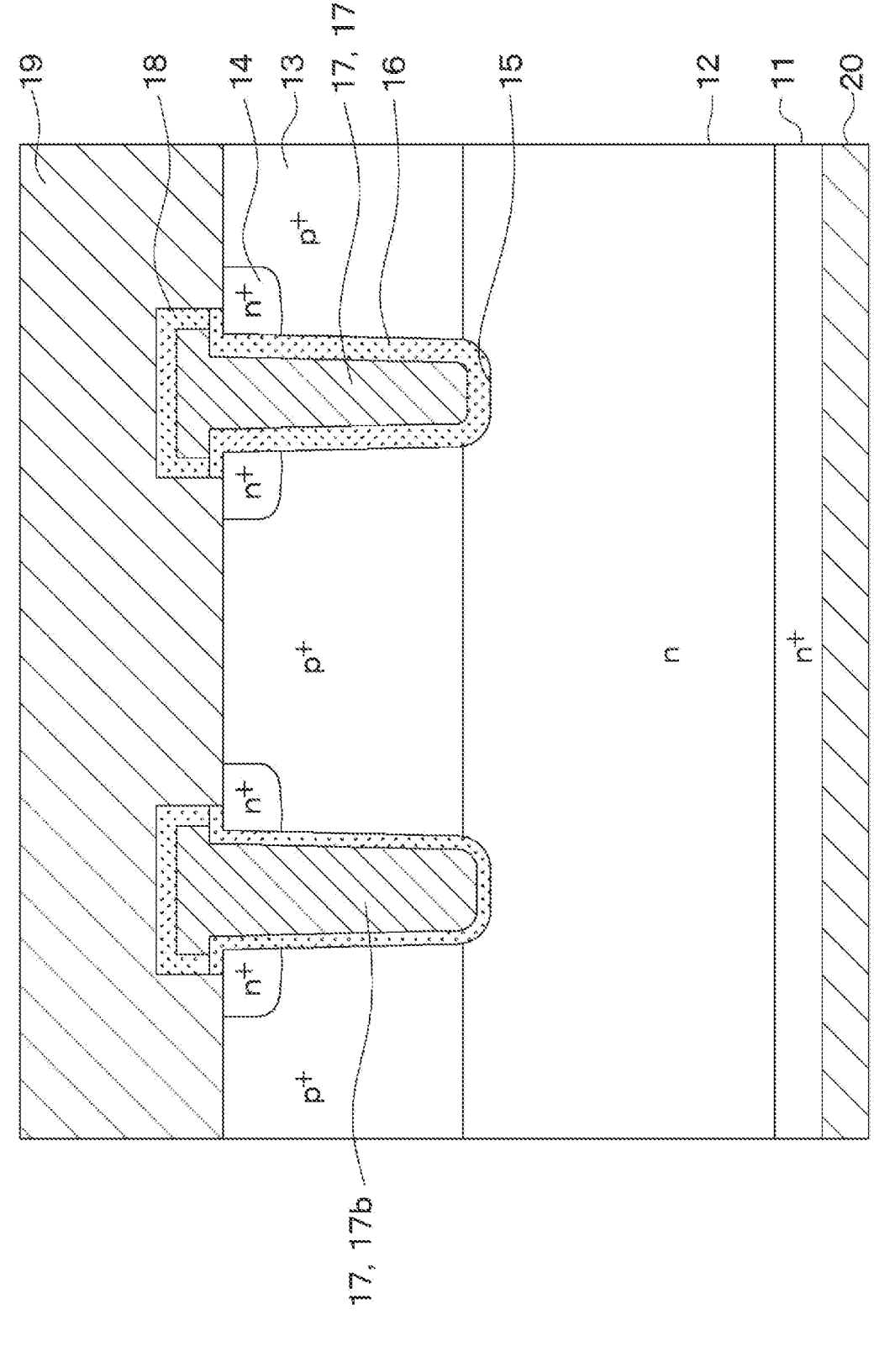
FIG. 14 is a diagram illustrating a cross-sectional view of a semiconductor element according to a seventh embodiment of the present disclosure.

The threshold voltage can be adjusted according to the thickness of the gate insulating film 16. That is, as shown in FIG. 14, the gate insulating film 16 in the trench 15 in which the first gate electrode 17*a* is formed is thicker than the gate insulating film 16 in the trench 15 in which the second gate electrode 17*b* is formed. Accordingly, the threshold voltage of the first cell region 7*a* is larger than that of the second cell region 7*b*.

Figure 15:
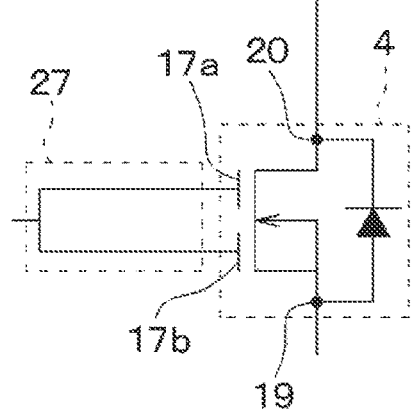
FIG. 15 is a circuit diagram of the semiconductor element and a control circuit according to the seventh embodiment.

In such a configuration, the first cell region 7*a* and the second cell region 7*b* can be connected to the drive circuit 26 by circuits having the same configuration. For example, as shown in FIG. 15, the connection circuit 27 is configured to short-circuit the first gate electrode 17*a* and the second gate electrode 17*b* to the drive circuit 26.

Alternatively, the connection circuit 27 is configured to have the configuration shown in FIG. 5, and the resistance value R1 and the resistance value R2 are equal to each other (i.e., R1=R2). Alternatively, the connection circuit 27 is configured to have the configuration shown in FIG. 11. In this case, the breakdown voltage of the Zener diode 32 is referred to as Vz1 and the breakdown voltage of the Zener diode 33 is referred to as Vz2, and the relationships of R1=R2 and Vz1=Vz2 are satisfied. The fact that the breakdown voltages Vz1 and Vz2 are equal to each other includes not only that they are exactly equal to each other but also that they are substantially equal to each other.

The present embodiment can achieve the similar effects to those of the first embodiment from the similar configuration and operation to those of the first embodiment.

Eighth Embodiment

The following describes an eighth embodiment of the present disclosure. The present embodiment is different from the first embodiment in the configuration of the control circuit 24, and the other parts are similar to those of the first embodiment. Therefore, only the part different from the first embodiment will be described.

Figure 16:
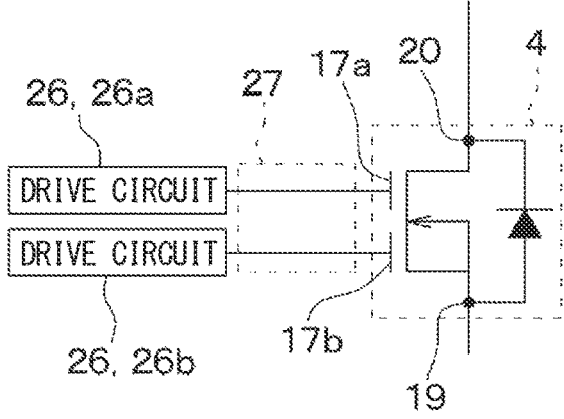
FIG. 16 is a circuit diagram of a semiconductor element and a control circuit according to an eighth embodiment of the present disclosure.

In the present embodiment, the time difference in current cutoff between the first cell region 7*a* and the second cell region 7*b* is generated by the driving capability of the drive circuit 26. In the present embodiment, as shown in FIG. 16, two drive circuits 26 are provided. The two drive circuits 26 are referred to as a first drive circuit 26*a* and a second drive circuit 26*b*, respectively.

The first drive circuit 26*a* is short-circuited to the first gate electrode 17*a* by the connection circuit 27, and the second drive circuit 26*b* is short-circuited to the second gate electrode 17*b* by the connection circuit 27. The first drive circuit 26*a* has a driving capability higher than that of the second drive circuit 26*b*.

The driving capability of the first drive circuit 26*a* is higher than the driving capability of the second drive circuit 26*b*. Therefore, when the first drive circuit 26*a* and the second drive circuit 26*b* simultaneously output the off signals, the gate voltage is decreased in the first cell region 7*a* prior to the second cell region 7*b*, so that the drain current of the first cell region 7*a* is cut off prior to the second cell region 7*b*. The second drive circuit 26*b* may output the off signal prior to the first drive circuit 26a as long as the drain current is cut off in the first cell region 7a prior to in the second cell region 7b.

The present embodiment can achieve the similar effects to those of the first embodiment from the similar configuration and operation to those of the first embodiment.

Other Embodiments

The present disclosure is not limited to the embodiments described hereinabove, and can be appropriately modified. The embodiments described above are not independent of each other, and can be appropriately combined except when the combination is obviously impossible. The constituent element(s) of each of the embodiments described above is/are not necessarily essential unless it is specifically stated that the constituent element(s) is/are essential in the embodiment, or unless the constituent element(s) is/are obviously essential in principle.

In each of the embodiments described above, the semiconductor element 4 is a DMOS element as an example. However, the semiconductor element 4 may be another semiconductor element. For example, the semiconductor element 4 may be an insulated gate bipolar transistor (IGBT) element.

In the first embodiment, the number of the first cell regions 7a and the number of the second cell regions 7b may be set as in the third embodiment. In the second and third embodiments, the connection circuit 27 may be formed on the semiconductor element 4 as in the fourth embodiment. In the second to fourth embodiments, the connection circuit 27 may be configured as in the fifth or sixth embodiment. In the second to fourth embodiments, the semiconductor element 4 may be configured as in the seventh embodiment. In the second and third embodiments, the drive circuit 26 may be configured as in the eighth embodiment.

In the third embodiment, two first cell regions 7a and one second cell region 7b may be alternately arranged. Alternatively, four or more first cell regions 7a and one second cell region 7b may be alternately arranged. As another example, one first cell region 7a and two or more second cell regions 7b may be alternately arranged. As further another example, two or more first cell regions 7a and two or more second cell regions 7b may be alternately arranged.

Figure 17:
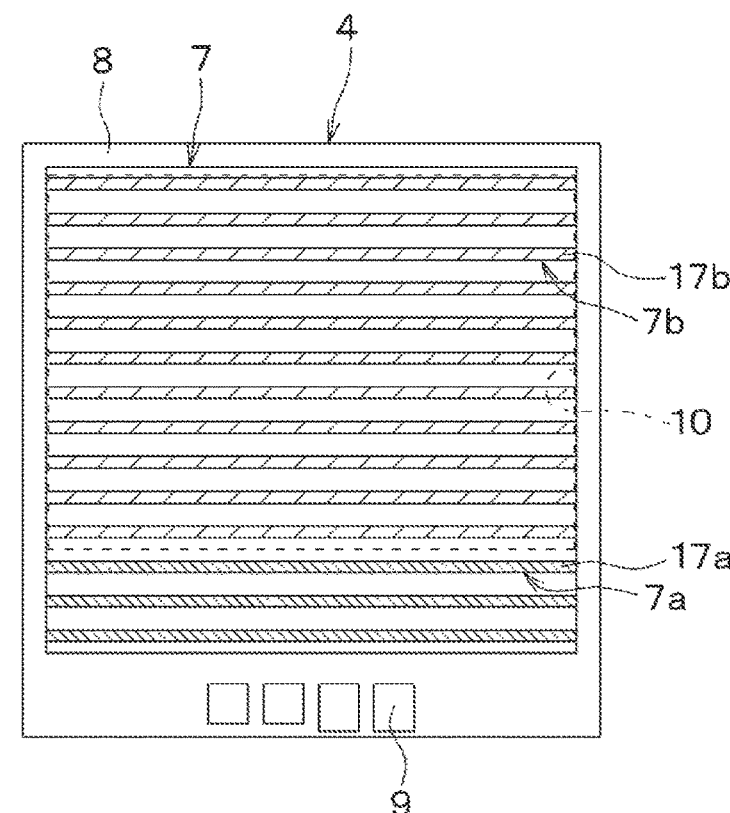
FIG. 17 is a diagram illustrating a top view of a semiconductor device according to another embodiment of the present disclosure.
Figure 18:
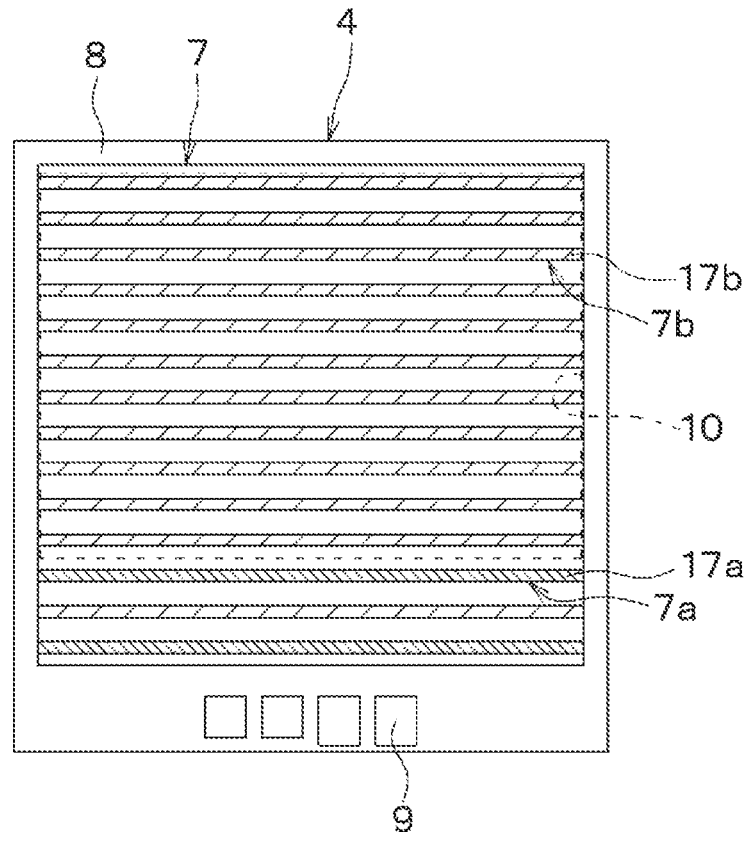
FIG. 18 is a diagram illustrating a top view of a semiconductor device according to another embodiment of the present disclosure.

As shown in FIGS. 17 and 18, the electrical connection member 6 may be disposed such that the heat dissipation region 10 includes a part of the outer peripheral portion of the cell region 7. As shown in FIG. 17, of the first cell region 7a and the second cell region 7b, only the second cell region 7b may be formed inside the heat dissipation region 10, and only the first cell region 7a may be formed outside the heat dissipation region 10. In each of the embodiments described above, the cells are thinned out in a pseudo manner at the time of cutting off the current. However, even by limiting the region in which the current is cut off before the other, as illustrated in FIG. 17, it is possible to suppress the temperature rise due to the current positive feedback at the time of cutting off the current while suppressing the increase in the on-resistance in the normal operation. In the case where the heat dissipation region 10 includes a part of the outer peripheral portion of the cell region 7, as shown in FIG. 18, of the first cell region 7a and the second cell region 7b, only the second cell region 7b may be formed inside the heat dissipation region 10, and both of the first cell region 7a and the second cell region 7b may be formed outside the heat dissipation region 10.

Figure 19:
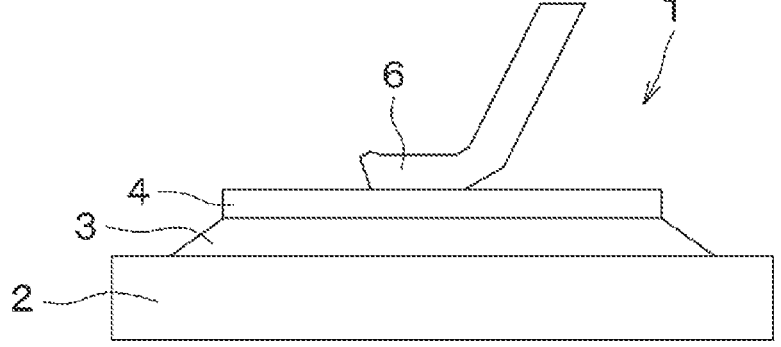
FIG. 19 is a diagram illustrating a side view of a semiconductor device according to another embodiment of the present disclosure.
Figure 20:
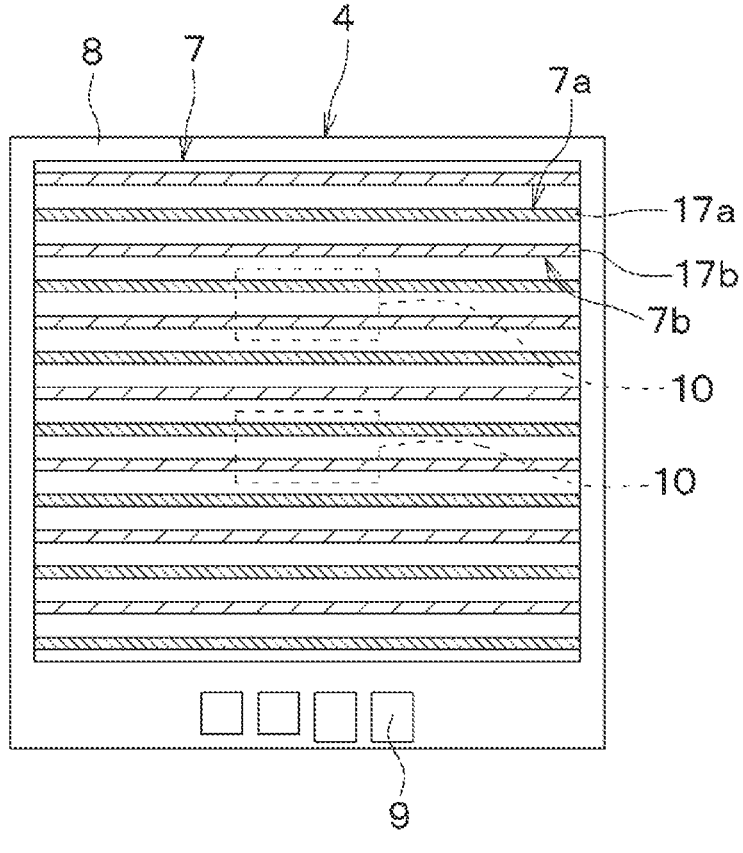
FIG. 20 is a diagram illustrating a top view of a semiconductor device according to another embodiment of the present disclosure.

As shown in FIG. 19, the electrical connection member 6 may be provided by a bonding wire. In this case, two electrical connection members 6 may be connected to the source electrode 19 to form two heat dissipation regions 10, as shown in FIG. 20.

In FIGS. 2, 7, 8, 9, 17 and 18, the first cell region 7a, the second cell region 7b, the first gate electrode 17a, and the second gate electrode 17b are disposed to extend in the left-right direction of the figures, but they may be disposed to extend in the up-down direction of the figures.

What is claimed is:

1. A semiconductor device comprising:
   a semiconductor element including a substrate, a front surface electrode disposed adjacent to a front surface of the substrate, a back surface electrode disposed adjacent to a back surface of the substrate, and a plurality of gate electrodes disposed adjacent to the front surface of the substrate, the semiconductor element being configured so that an electrical conduction and cutoff between the front surface electrode and the back surface electrode is controlled by application of voltages to the plurality of gate electrodes;
   a control circuit including a connection circuit that connects a drive circuit and the plurality of gate electrodes, the drive circuit being configured to output the voltages applied to the plurality of gate electrodes; and
   an electrical connection member disposed on a front surface side of the semiconductor element and electrically connected to the front surface electrode, wherein
   the plurality of gate electrodes include a first gate electrode and a second gate electrode,
   the semiconductor element has a cell region,
   the cell region includes a first cell region that allows a current to flow between the front surface electrode and the back surface electrode when the first gate electrode is applied with the voltage, and a second cell region that allows a current to flow between the front surface electrode and the back surface electrode when the second gate electrode is applied with the voltage,
   the semiconductor element and the control circuit are configured to generate a time difference in current cutoff between the first cell region and the second cell region at a time of cutting off the currents flowing through the first cell region and the second cell region,
   the electrical connection member is disposed so as to cover a part of the front surface side of the semiconductor element,
   the first cell region is disposed to be included in a part located outside of the part below the electrical connection member in the semiconductor element, and
   the second cell region is disposed to be included in the part below the electrical connection member in the semiconductor element.

2. The semiconductor device according to claim 1, wherein
   the semiconductor element and the control circuit are configured to cut off the current in the first cell region before the current in the second cell region is cut off, at the time of cutting off the currents flowing through the first cell region and the second cell region.

3. The semiconductor device according to claim 1, wherein
   the part of the semiconductor element below the electrical connection member includes the second cell region other than the first cell region, and the part of the semiconductor element outside of the part below the electrical connection member includes the first cell region and the second cell region.

4. The semiconductor device according to claim 1, wherein the drive circuit and the first gate electrode are short-circuited, and the drive circuit and the second gate electrode are connected to each other via a resistor.

5. The semiconductor device according to claim 1, wherein the drive circuit and the first gate electrode are connected to each other via a first resistor, and the drive circuit and the second gate electrode are connected to each other via a second resistor having a resistance value larger than that of the first resistor.

6. The semiconductor device according to claim 1, wherein the drive circuit and the first gate electrode are connected to each other via a first resistor, the drive circuit and the second gate electrode are connected to each other via a second resistor having a resistance value equal to that of the first resistor, the first gate electrode and the surface electrode are connected via a circuit in which a fourth resistor and a first capacitor are connected in series, and the second gate electrode and the surface electrode are connected to each other via a circuit in which a fifth resistor and a second capacitor having a capacitance larger than that of the first capacitor are connected in series.

7. The semiconductor device according to claim 1, wherein the first gate electrode is connected to a first drive circuit, the second gate electrode is connected to a second drive circuit, and the first drive circuit has a driving capability higher than that of the second drive circuit.

8. The semiconductor device according to claim 1, wherein the drive circuit is short-circuited to the first gate electrode and the second gate electrode, and the first cell region has a threshold voltage larger than a threshold voltage of the second cell region.

9. The semiconductor device according to claim 1, wherein the drive circuit and the first gate electrode are connected to each other via a first resistor, the drive circuit and the second gate electrode are connected to each other via a second resistor having a resistance value equal to that of the first resistor, and the first cell region has a threshold voltage larger than a threshold voltage of the second cell region.

10. The semiconductor device according to claim 1, wherein the drive circuit and the first gate electrode are connected to each other via a first resistor, the drive circuit and the second gate electrode are connected to each other via a second resistor having a resistance value equal to that of the first resistor, the first gate electrode and the back surface electrode are connected to each other via a first bidirectional Zener diode, the second gate electrode and the back surface electrode are connected to each other via a second bidirectional Zener diode, a breakdown voltage of the first bidirectional Zener diode on a first gate electrode side is larger than a voltage applied to the first gate electrode in a normal operation of the semiconductor element, a breakdown voltage of the second bidirectional Zener diode on a second gate electrode side is larger than a voltage applied to the second gate electrode in the normal operation of the semiconductor element, a breakdown voltage of the first bidirectional Zener diode and a breakdown voltage of the second bidirectional Zener diode are equal to each other on a back surface electrode side, and the first cell region has a threshold voltage larger than a threshold voltage of the second cell region.

11. The semiconductor device according to claim 1, wherein the connection circuit is disposed in a region of the semiconductor element in which no cell is arranged.

12. A semiconductor device comprising:

a semiconductor element including a substrate, a front surface electrode disposed adjacent to a front surface of the substrate, a back surface electrode disposed adjacent to a back surface of the substrate, and a plurality of gate electrodes disposed adjacent to the front surface of the substrate, the semiconductor element being configured so that an electrical conduction and cutoff between the front surface electrode and the back surface electrode is controlled by application of voltages to the plurality of gate electrodes;

a control circuit including a connection circuit that connects a drive circuit and the plurality of gate electrodes, the drive circuit being configured to output the voltages applied to the plurality of gate electrodes; and an electrical connection member disposed on a front surface side of the semiconductor element and electrically connected to the front surface electrode, wherein the plurality of gate electrodes include a first gate electrode and a second gate electrode, the semiconductor element has a cell region, the cell region includes a first cell region that allows a current to flow between the front surface electrode and the back surface electrode when the first gate electrode is applied with the voltage, and a second cell region that allows a current to flow between the front surface electrode and the back surface electrode when the second gate electrode is applied with the voltage, the semiconductor element and the control circuit are configured to generate a time difference in current cutoff between the first cell region and the second cell region at a time of cutting off the currents flowing through the first cell region and the second cell region, the drive circuit and the first gate electrode are connected to each other via a first resistor, the drive circuit and the second gate electrode are connected to each other via a second resistor having a resistance value equal to that of the first resistor, the second gate electrode and the back surface electrode are connected to each other via a bidirectional Zener diode, and a breakdown voltage of the bidirectional Zener diode on a second gate electrode side is larger than a voltage applied to the second gate electrode in a normal operation of the semiconductor element.

13. The semiconductor device according to claim 1, wherein the drive circuit and the first gate electrode are connected to each other via a first resistor, the drive circuit and the second gate electrode are connected to each other via a second resistor having a resistance value equal to that of the first resistor, the first gate electrode and the back surface electrode are connected to each other via a first bidirectional Zener diode, the second gate electrode and the back surface electrode are connected to each other via a second bidirectional Zener diode, a breakdown voltage of the first bidirectional Zener diode on a first gate electrode side is larger than a voltage applied to the first gate electrode in a normal operation of the semiconductor element;

a breakdown voltage of the second bidirectional Zener diode on a second gate electrode side is larger than a voltage applied to the second gate electrode in the normal operation of the semiconductor element; and a breakdown voltage of the second bidirectional Zener diode on a back surface electrode side is smaller than a breakdown voltage of the first bidirectional Zener diode on a back surface electrode side.

14. A semiconductor device comprising:

a semiconductor element including a substrate, a front surface electrode disposed adjacent to a front surface of the substrate, a back surface electrode disposed adjacent to a back surface of the substrate, and a plurality of gate electrodes disposed adjacent to the front surface of the substrate, the semiconductor element being configured so that an electrical conduction and cutoff between the front surface electrode and the back surface electrode is controlled by application of voltages to the plurality of gate electrodes;

a control circuit including a connection circuit that connects a drive circuit and the plurality of gate electrodes, the drive circuit being configured to output the voltages applied to the plurality of gate electrodes; and an electrical connection member disposed on a front surface side of the semiconductor element and electrically connected to the front surface electrode, wherein the plurality of gate electrodes include a first gate electrode and a second gate electrode, the semiconductor element has a cell region, the cell region includes a first cell region that allows a current to flow between the front surface electrode and the back surface electrode when the first gate electrode is applied with the voltage, and a second cell region that allows a current to flow between the front surface electrode and the back surface electrode when the second gate electrode is applied with the voltage, the semiconductor element and the control circuit are configured to generate a time difference in current cutoff between the first cell region and the second cell region at a time of cutting off the currents flowing through the first cell region and the second cell region, the drive circuit and the first gate electrode are connected to each other via a first resistor, the drive circuit and the second gate electrode are connected to each other via a second resistor having a resistance value equal to that of the first resistor, and the second gate electrode and the front surface electrode are connected to each other via a circuit in which a third resistor and a capacitor are connected in series.

* * * * *